United States Patent [19]

Adler et al.

[11] Patent Number: 5,083,093
[45] Date of Patent: Jan. 21, 1992

[54] CIRCUIT FOR COUPLING ENERGY TO PULSE FORMING NETWORK OR CAPACITOR

[75] Inventors: Richard J. Adler, Albuquerque, N. Mex.; R. Fred Nylander, Mountain View, Calif.

[73] Assignee: Varian Associates, Inc., Palo Alto, Calif.

[21] Appl. No.: 542,212

[22] Filed: Jun. 22, 1990

[51] Int. Cl.⁵ .......................... H03K 3/53; H03K 3/57
[52] U.S. Cl. ...................................... 328/65; 307/633; 328/67
[58] Field of Search ...................... 328/65, 67; 307/633

[56] References Cited

U.S. PATENT DOCUMENTS

| | | | |
|---|---|---|---|
| 3,139,585 | 6/1964 | Ross et al. | 328/67 |
| 3,328,703 | 6/1967 | Lee | 328/67 |
| 3,363,184 | 1/1968 | Smith | 328/67 |
| 3,473,049 | 10/1969 | Alexander | 328/67 |
| 3,867,684 | 2/1975 | Ginsberg et al. | 328/67 |
| 3,914,697 | 10/1975 | Feldmesser | 328/67 |
| 4,150,307 | 4/1979 | Loucks | 328/67 |

OTHER PUBLICATIONS

Voak, K. F., "Secondary Pulse Voltage Regulation," pp. 9-464-9-481.
Smith, W. I., "The Design of a Modulator-Power Supply System for the Stanford Two-Mile Linear Accelerator," pp. 7-312-7-320.
Schonberg, R. E., "High Power Pulse System Regulation," pp. 6-313-6-322.
Slampyak, S., "A Unique Regulator by Deqing Methods," pp. 9-482-9-489.

Primary Examiner—John Zazworsky
Attorney, Agent, or Firm—Peter J. Sgarbossa

[57] ABSTRACT

A pulse forming network or capacitor load is charged to a precise voltage from an energy storing device with a circuit including a transformer having a primary connected in series with a switch and storage device and a secondary connected in series with the load and a monitor circuit. The monitor circuit develops an output signal indicative of the load voltage and current. In response to the output signal increasing to a predetermined value the switch is opened. The transformer, having a substantial leakage inductance, releases its stored energy when the switch is opened. The transformer stored energy is coupled to the load and to a capacitor connected to the primary. Charge stored in the capacitor after the load requirements have been satisfied is transferred back to the energy storage device.

36 Claims, 1 Drawing Sheet

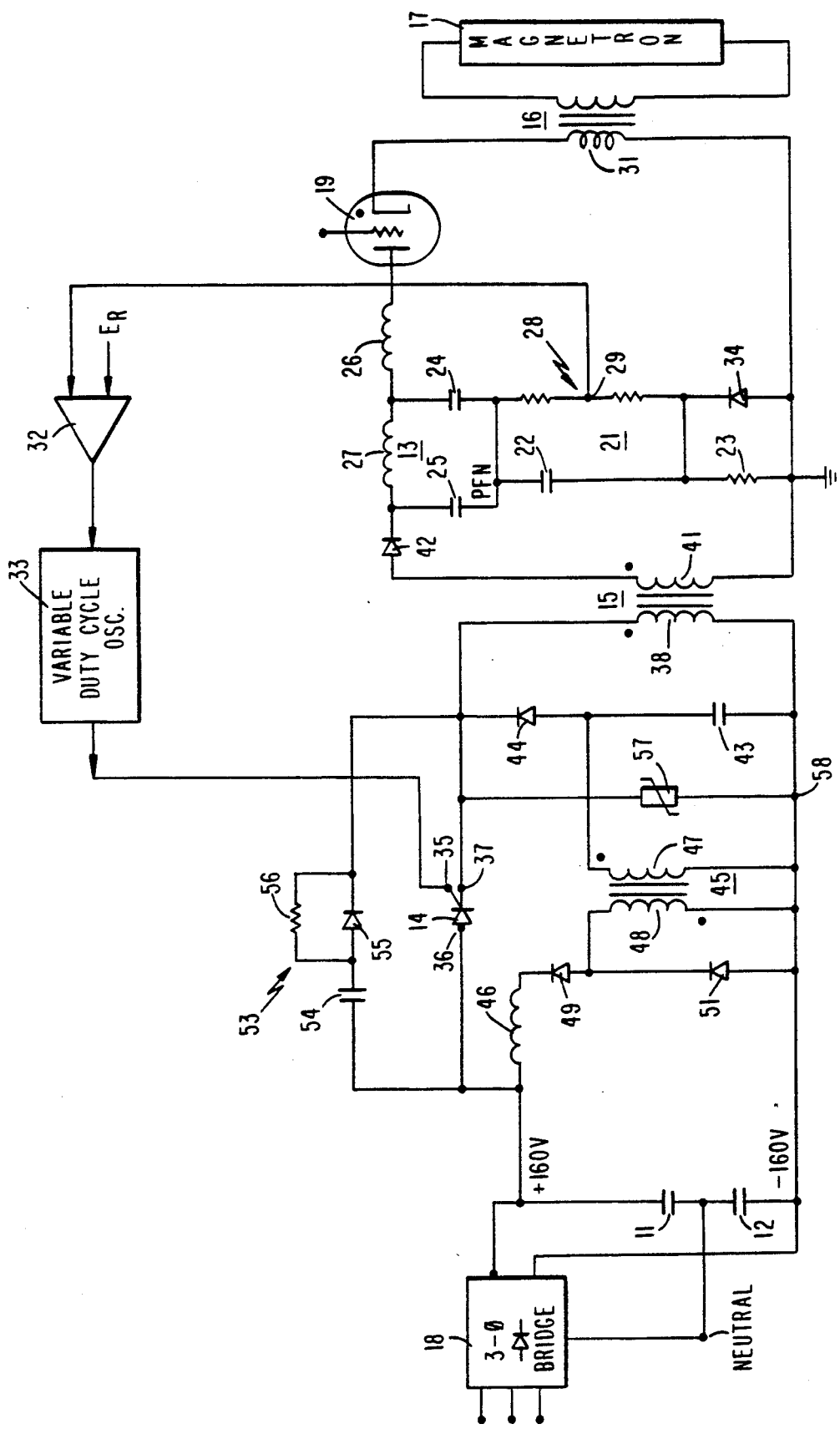

CIRCUIT FOR COUPLING ENERGY TO PULSE FORMING NETWORK OR CAPACITOR

FIELD OF INVENTION

The present invention relates generally to a circuit for charging a pulse forming network (PFN) or a capacitor load via a switch connected between an energy storage device and a step up transformer and more particularly to such a circuit including a monitor for deriving a control signal for the switch in response to the load voltage and current. In accordance with a further aspect of the invention, a circuit for charging a pulse forming network or capacitor load via a switch between an energy storage device and a step up transformer includes circuit elements for coupling excess energy, not coupled to the load, back to the energy storage device.

BACKGROUND ART

Pulse forming networks are frequently employed to supply short duration, high voltage pulses to various types of loads, such as magnetrons. The pulse forming networks are usually charged from a complex, high voltage DC source, such as a 10 kilovolt source, connected to a step up transformer by way of a switch. It is a requirement for the pulse forming network output voltage to achieve a precise value. Previously "De-Qing" circuits have been used to enable the precise pulse forming network voltage to be achieved. A De-Qing circuit uses a second, separate network to remove excess energy from the pulse forming network. The excess energy is dissipated in resistors forming part of the De-Qing circuit. Hence, the prior art arrangement is relatively inefficient and requires a significant number of components. Typical prior art De-Qing circuits are disclosed in the following publications: "A Unique Regulator by De-Qing Method," Slampyak, 1966, pages 482–489, Ninth Power Modulator Symposium; "High-power Pulse System Regulation," Schonberg, 1960, pages 313–322, Sixth Power Modulator Symposium; "Design for the Stanford Two Mile Linear Accelerator," Smith, 1962, Seventh Power Modulator Symposium, pages 312–320, and "Secondary Pulse Voltage Regulation," Voak, 1966, Ninth Power Modulator Symposium, pages 464–480.

DISCLOSURE OF THE INVENTION

It is, accordingly, an object of the present invention to provide a new and improved circuit for efficiently coupling energy from a relatively low voltage DC source through a switch and a step up transformer to a pulse forming network or capacitor load, such that the load voltage is maintained at a precise value.

Another object of the invention is to provide a new and improved circuit for coupling energy from a relatively low voltage DC source through a switch and a step up transformer to a pulse forming network or capacitor load, wherein the switch is opened prior to the load voltage achieving the desired level to minimize coupling of excess energy from the energy storage device to the load.

Still another object of the invention is to provide a new and improved circuit for supplying energy to a pulse forming network or capacitor from an energy storage device via a switch and step up transformer, wherein energy stored in the network or capacitor at the time the switch is open is transferred to the load and excess energy, not needed by the load, is coupled back to the energy storage device.

An additional object of the invention is to reduce the size of components employed in a circuit for charging a pulse forming network or a capacitor to a precise voltage, wherein the size reduction is provided as a result of (1) efficient transfer of energy from the energy storage device to the PFN or capacitor and coupling excess energy, not needed by the PFN or capacitor, back to the energy storage device, and (2) most power handling being at low voltage.

In accordance with one aspect of the present invention, a circuit for charging a pulse forming network or capacitor to a precise voltage from an energy storage device comprises a switch, a monitor circuit and a transformer having a first winding means connected in series with the switch and energy storage device and a second winding means connected in series with the load and monitor circuit. In response to current flowing from the energy storage device through the switch to the first winding means, the second winding means couples current to the PFN or capacitor and monitor circuit. The monitor circuit responds to the PFN voltage and current to develop an output signal indicative of the load voltage and current. The switch is turned off in response to the output signal having a predetermined value.

Because the output signal is responsive to the load voltage and current, the output signal leads the output voltage, i.e., the voltage applied by the pulse forming network or capacitor to a load. Because the output signal, which controls switch turn off time, leads the output voltage the switch is open when the load voltage is less than the final precise, desired value for the PFN voltage. The PFN or capacitor load is charged to the precise value in response to energy stored in the step up transformer at the time the switch is turned off. When the precise voltage is reached, current flow from the second winding means to the PFN or capacitor ceases by virtue of passive components in circuit with the transformer.

In accordance with a further feature of the invention, energy stored in the step up transformer at the time the pulse forming network or capacitor load achieves the precise desired voltage is transferred back to the energy storage device. In other words, excess energy stored in the transformer and not needed by the load, is coupled back to the energy storage device. To this end, the first winding means of the step up transformer is connected with a branch circuit including a capacitor. The capacitor is initially charged by the transformer at the time the switch turns off and continues to circulate current with the transformer and load until the precise, desired load voltage is achieved. When the load voltage is achieved, a diode connected to the second winding means and the load becomes back biased and current in the second winding means stops flowing. The excess energy, not needed to attain the precise, desired load voltage, stored in the transformer at the time the switch turned off has now been basically transferred to the capacitor. The energy stored by the capacitor is then coupled back to the energy storage device. Because excess energy is transferred from the step up transformer to the energy storage device, instead of being dissipated, there is a substantial reduction in the size and volume of components, with resulting cost savings.

In the preferred embodiment, energy is coupled from the capacitor to the energy storage device by a second step up transformer. The branch circuit and second transformer are connected to the switch to prevent an excessively high voltage from being developed across the switch at the time the switch opens. Thereby, the switch, preferably a semiconductor device such as a gate turnoff thyristor (GTO), an externally commutated thyristor, an isolated gate bipolar transistor (IGBT), or field effect devices (MOSFETs and MCTs), is protected from an excessive back voltage, which has a tendency to occur as the switch is opened. Such protection is important to prevent breakdown and failure of the switch.

It is, accordingly, still another object of the invention to provide a new and improved circuit for transferring energy from an energy storage device to a capacitive or pulse forming network load by way of a step up transformer and a semiconductor switch, wherein circuitry to prevent excess voltage from being developed across the switch at the time the switch opens, transfers excess energy from the step up transformer to the energy storage device.

In accordance with a further aspect of the invention, a circuit for charging a pulse forming network or capacitor load to a precise voltage from an energy source comprises a switch and a transformer having a first winding means connected in series with the switch and energy storage device and a second winding means connected in series with the load, to couple current to the load. The current flowing in the second winding means flows therein in response to current flowing from the energy storage device through the switch to the first winding means. In response to the load the switch is opened prior to the load reaching the precise voltage. The opening time of the switch, the transformer, the load and circuitry connected to them are such that the second winding means continues to couple energy to the load after the switch has opened to cause the load voltage to attain the precise voltage.

In accordance with still another aspect of the invention, a circuit for charging a pulse forming network or capacitor load from an energy storage device comprises a switch and a transformer having a first winding means connected in series with the switch and energy storage device and a second winding means connected in series with the load to couple current to the load. The current flowing in the second winding means flows therein in response to current flowing from the energy storage device through the switch to the first winding means. A branch circuit in shunt with the first winding means includes a capacitor charged in response to energy stored in the transformer while the switch is switched from a closed to an open state. The switch, branch circuit, transformer and load are connected so first and second portions of the current charging the capacitor are respectively coupled to the load and the energy storage device.

In the preferred embodiment, the means for coupling the second current portion limits the voltage across the switch after the switch is open. The means for coupling the second current portion includes a second transformer having a third winding means connected to be responsive to the second current portion and fourth winding means connected via a first impedance means to one electrode of the switch and the energy storage means. The branch circuit includes a second impedance means connected to another electrode of the switch.

The above and still further objects, features and advantages of the present invention will become apparent upon consideration of the following detailed description of a specific embodiment thereof, especially when taken in conjunction with the accompanying drawings.

BRIEF DESCRIPTION OF DRAWING

The sole figure is a circuit diagram of a preferred embodiment of the invention.

DESCRIPTION OF THE PREFERRED EMBODIMENT

Reference is now made to the figure wherein energy stored on series connected capacitors 11 and 12 is transferred to pulse forming network 13 by way of switch 14, configured as a gate turnoff thyristor (GTO), and step up transformer 15 having a substantial leakage inductance. The energy is transferred as high voltage pulses to pulse forming network 13 which derives a high voltage having a desired, precise value. The high voltage pulses are shaped by pulse forming network 13 and thyratron 19 and coupled by pulse transformer 16 to a resistive load 17, typically a pair of magnetron electrodes. Pulses having a duration of a few microseconds and voltage levels of 40 to 50 kilovolts are supplied to magnetron 17.

Each of capacitors 11 and 12 is charged to a voltage of 160 volts DC by DC source 18, preferably a three-phase rectifying bridge responsive to three-phase AC mains, so that the total DC voltage across capacitors 11 and 12 is 320 volts. To provide the necessary voltage level for magnetron 17, the turns ratios of step up transformers 15 and 16 are respectively approximately 40:1 and 4:1.

To control the voltage across pulse forming network 13 to a precise value, the time during which switch 14 is closed, to conduct current from capacitors 11 and 12 to transformer 15, is controlled. To control the conduction duration of switch 14, circuit 21 monitors the voltage supplied to PFN 13 and the current flowing through the PFN. Monitor circuit 21, connected in series with pulse forming network 13, derives an output signal having an increasing value from the time switch 14 closes. The signal value is proportional to the pulse forming network voltage times a constant plus the pulse forming network current times another constant. By summing the parameters indicative of the pulse forming network voltage and current the monitor circuit output signal basically leads the voltage supplied to the pulse forming network 13 by transformer 15.

The monitor circuit output signal value is compared with a reference value therefor. In response to the monitor circuit signal value reaching the reference value, switch 14 is activated from a closed to an open state. When switch 14 is activated from the closed to the open state, the voltage supplied to pulse forming network 13 by transformer 15 is less than the desired, precise value therefor. Energy stored in transformer 15 is transferred to pulse forming network 13, so that the voltage of the pulse forming network 13 continues to rise until it reaches the precise, predetermined value.

To these ends, monitor circuit 21 includes the series combination of capacitor 22 and resistor 23, in turn connected in series with capacitors 24 and 25 of pulse forming network 13; the pulse forming network also includes series inductors 26 and 27 and may include other suitably connected components. Capacitor 22 is shunted by resistive voltage divider 28, including tap 29. The voltage developed across capacitor 22 is considered a first response indicative of the voltage supplied to PFN 13 by winding 41 of transformer 15, while the voltage across resistor 23 is considered a second response indicative of the current flowing through pulse forming network 13. The voltage at tap 29 can be represented as:

$$aV + bf(I),$$

where:
a and b are constants,
V = voltage across winding 41, and
f(I) is a polynomial function (having an order no higher than 2) of the current (I) supplied by transformer 15 to pulse forming network 13, i.e., $f(i) = bI$ or $cI^2$.

The voltage at tap 29 is coupled to one input of comparator 32, having a second input responsive to a predetermined DC reference voltage, $E_R$. In response to the voltage at tap 29 being less than $E_R$, comparator 32 derives a binary zero output level. In response to the voltage at tap 29 being equal to or in excess of $E_R$ the output of comparator 32 has a binary one value. Bypass diode 34, shunting resistor 23, prevents coupling of high transient voltages to comparator 32 due to current flow in resistor 23 when PFN 13 is discharged as a result of magnetron 17 being pulsed.

The binary zero to one transition at the output of comparator 32 is supplied to the input of variable duration pulse source 33. Pulse source 33 is configured either as a constant frequency, variable duty cycle oscillator, or as a variable frequency oscillator having a fixed period between each opening and closing of switch 14; the interval between each closing and opening of switch 14 is controlled by source 33. The binary zero to one transition in the output of comparator 32 causes the output of oscillator 33 to shift from a positive to a negative voltage.

The output of pulse source 33 is coupled to gate electrode 35 of a gate turnoff thyristor (GTO) forming switch 14. Anode 36 and cathode 37 of the GTO forming switch 14 are respectively connected to the high voltage electrode of capacitor 11 and to one terminal of primary winding 38 of transformer 15. The GTO is activated into a conducting, closed state in response to a positive voltage being applied to gate 35 by the output of pulse source 33. The GTO remains in the conducting state until a negative voltage is applied to gate 35 by the output of pulse source 33. The time during which current flows between anode 36 and cathode 37 to primary winding 38 controls the amount of energy transferred from capacitors 11 and 12 to transformer 15 during each cycle of pulse source 33.

When switch 14 is initially activated into the conducting state, the current flowing from capacitors 11 and 12 through the switch has a zero value. Current continues to flow in switch 14 until the switch is open in response to the voltage at tap 29 being equal to the value of $E_R$. While switch 14 is closed, the current through switch 14 has a sinusoidal like waveform having a duration of less than one-half a cycle. The waveform shape, i.e., the initial slope thereof and the time required for the waveform to reach the peak value of the sinusoidal function, is determined by the reactive impedance reflected to primary winding 38. When switch 14 is open in response to the negative transition at the output of pulse source 33, the current through switch 14 drops abruptly to approximately a zero value.

A replica of the sinusoidal like current waveform flowing through switch 14 while the switch is closed is coupled by primary winding 38 of transformer 15 to the transformer secondary winding 41. The resulting current induced in winding 41 flows out of the dotted end of winding 41 through diode 42 to pulse forming network 13, thence to monitor circuit 21. Capacitors 24 and 25, as well as inductor 27, of pulse forming network 13 are thereby charged. The voltage and current supplied by winding 41 and diode 42 to pulse forming network 13 are monitored by circuit 21 to provide the control signal for the input of comparator 32.

When switch 14 is opened, considerable energy is stored in transformer 15. The stored energy in transformer 15 is coupled to capacitor 43 in a branch circuit including diode 44 shunting primary winding 38 of transformer 15. Thereby, current continues to flow through primary winding 38 in the same direction as when switch 14 was closed. The current path is from the undotted end of winding 38 through capacitor 43 and diode 44 back to the dotted end of winding 38. The current flowing in winding 38 after switch 14 is open causes positive current to continue to flow out of the dotted end of secondary winding 41 through diode 42 and pulse forming network 13, thence through monitor circuit 21 back to the undotted end of transformer 41. While switch 14 is closed, the voltage across capacitor 43 is very low because the capacitor is decoupled by diode 44 from the current flowing through the switch.

The voltage across capacitors 11 and 12, values of capacitor 43 and the component values of pulse forming network 13, as well as the leakage inductance of transformer 15 and the characteristics of diode 42, control when the precise predetermined desired voltage is achieved across pulse forming network 13. Current continues to circulate in primary winding 38, capacitor 43 and diode 44 until the precise desired voltage for pulse forming network 13 is achieved. The desired precise voltage for pulse forming network 13 is achieved when the current flowing in primary winding 38 has charged capacitor 43 to a peak voltage and the voltage at the dotted end of winding 38 has dropped sufficiently to cause the voltage at the cathode of diode 44 to exceed the voltage at the anode thereof.

When current stops flowing through diode 44 and primary winding 38, current also stops flowing through secondary winding 41 and diode 42, so that pulse forming network 13 is charged to the precise desired output voltage thereof. This occurs many microseconds after switch 14 is open circuited in response to the output of oscillator 33. The precise, desired voltage for PFN 13 is maintained constant until magnetron 17 is pulsed because of the blocking action, i.e., high impedance state of diode 42 when current stops flowing in secondary winding 41. Magnetron 17 is pulsed by applying a positive voltage from a source (not shown) to the grid of thyratron 19. The duration of the pulse is controlled by the impedances of PFN 13, such that the thyratron is turned off when the output voltage of PFN 13, applied to the thyratron anode, drops to zero.

When current stops flowing in diode 44 and winding 38, residual charge is usually left on capacitor 43. This charge is excess energy supplied by capacitors 11 and 12 to transformer 15, and not needed by PFN 13 to achieve the desired, precise voltage. The residual charge on capacitor 43 is returned to energy storage capacitors 11 and 12 by way of polarity inverting, step up transformer 45 and current limiting inductor 46. To this end, primary winding 47 of transformer 45 is connected in shunt with capacitor 43. When current stops flowing through primary winding 38 of transformer 15, capacitor 43 is charged so that the electrode thereof connected to the undotted end of winding 38 has a positive voltage relative to the electrode of the capacitor connected to the anode of diode 44. Capacitor 43 is discharged through primary winding 47 of transformer 45 so that current now flows from the positively charged electrode of capacitor 43 into the undotted end of winding 47. The current flowing into the undotted end of transformer winding 47 induces a current in secondary winding 48 of transformer 45. The current induced in secondary winding 48 flows out of the undotted end of secondary winding 48 through diode 49, thence through current limiting inductor 46 to capacitors 11 and 12. Thereby, capacitors 11 and 12 are recharged with the excess energy stored in transformer 15.

Because of the inductance of transformer 15 and the inductive impedance reflected to the transformer, there is a tendency for a substantial back voltage to be developed across switch 14 at the time the switch is activated from a closed to an open state in response to the negative going output of pulse source 33. If the back voltage across semiconductor switch 14 exceeds a predetermined value when the switch is opened, there is a tendency for the switch to be weakened or destroyed. With the present circuit, however, the voltage across primary winding 38 does not change drastically when switch 14 is open circuited because of the current path provided by capacitor 43 and diode 44 for the energy stored in transformer 15. Thereby, the back voltage across anode 36 and cathode 37 at the time that the GTO comprising switch 14 is open, is not excessively high (limited to about 600 volts) and does not result in damage to the GTO.

Secondary winding 48 of transformer 45 is shunted by diode 51, having an anode connected to the dotted end of winding 48 and a cathode connected to the undotted end of the winding and to the anode of diode 49. Diode 51 is a free-wheeling diode, providing a current path to capacitors 11 and 12 for energy stored in inductor 46 at the time positive current stops flowing from the undotted end of winding 48.

Voltage snubber circuit 53, connected in shunt with anode 36 and cathode 37 of the GTO forming switch 14, protects the switch from the voltage effects of parasitic inductance in the circuit. Snubber 53 includes capacitor 54, connected in series with the parallel combination of fast recovery time diode 55, in turn connected in parallel with resistor 56. Diode 55 is poled in the same direction as the GTO forming switch 14, so that the cathodes of the GTO and diode 55 have a common terminal.

Varistor 57, connected between cathode 37 of the GTO forming switch 14 and terminal 58, maintained at −300 volts DC, protects the GTO from excessive voltages. Varistor 57 has characteristics similar to those of a pair of series connected back to back Zener diodes, such that the varistor is virtually a short circuit for voltages in excess of a predetermined level, e.g., 700 volts; for voltages less than 500 volts, the varistor impedance is virtually an open circuit.

The circuit of the present invention provides precise control of the output voltage of pulse forming network 13, independently of the voltage across input capacitors 11 and 12. Thereby, a precise output voltage is provided, even though the AC input to bridge 18 is unregulated. In addition, excess energy, not needed by pulse forming network 13, is returned to capacitors 11 and 12. This is important because of the concomitant voltage, current, volume and price reductions of many of the circuit components. The relatively high efficiency circuit has low heat dissipation properties, which reduces the cooling expenses for the semiconductor components, which must be maintained at relatively low temperature. This circuit also has the advantage of a relatively low number of parts, leading to a relatively inexpensive, highly regulated, efficient circuit.

While there has been described and illustrated one specific embodiment of the invention, it will be clear that variations in the details of the embodiment specifically illustrated and described may be made without departing from the true spirit and scope of the invention as defined in the appended claims. For example, the GTO used in switch 14 can be replaced by an SCR/counterpulse SCR circuit or by an IGBT or array of IGBT's. A second example is that transformer 45 can be replaced by a third winding on transformer 15, and the energy remaining after the GTO is turned off can be coupled back to capacitors 11 and 12 as discussed.

We claim:

1. A circuit for charging a pulse forming network or capacitor load to a precise voltage from an energy storage device comprising a switch, a monitor circuit, a transformer having a first winding means connected in series with said switch and energy storage device and a second winding means connected in series with said load and monitor circuit, the second winding means coupling current to said load and monitor circuit, the current flowing in the second winding means flowing therein in response to current flowing from the energy storage device through the switch to the first winding means, the monitor circuit being responsive to the voltage across the load and the current flowing through the load to develop an output signal indicative of the voltage across the load and the current flowing through the load, and means responsive to the output signal having a predetermined value for opening said switch.

2. The circuit of claim 1 wherein the transformer has a tendency to store energy while current flows in the first winding means, and means for coupling some of the energy stored in the transformer at the time the switch opens to the energy storage device.

3. The circuit of claim 2 wherein the energy coupling means includes: a capacitor connected to one of the winding means to be responsive to current flowing in said one winding means at the time the switch is opened so that charge is accumulated on the capacitor in response to the energy stored in the transformer when the switch is opened, and means for transferring some of the charge accumulated on the capacitor to the energy storage device.

4. The circuit of claim 3 wherein the charge transferring means includes another transformer having a third winding means connected to be responsive to accumulated charge on the capacitor and a fourth winding means connected to the energy storage device.

5. The circuit of claim 4 wherein the capacitor is connected to the first winding means so current flowing through the first winding means flows to the capacitor when the switch switches from a closed to an open state, the switch being a semiconductor device incapable of withstanding more than a predetermined voltage, and means for controlling the voltage across the switch so the voltage across the semiconductor device is limited to a value that is less than the predetermined voltage when the switch switches from a closed to an open state.

6. The circuit of claim 1 wherein the monitor circuit is connected in circuit with the load and second winding means and includes a first impedance for deriving a first response for the load voltage and a second impedance for deriving a second response for the load current.

7. The circuit of claim 6 further including means for discharging the load and wherein the first and second impedances respectively include a monitor capacitor and a resistor, the resistor and monitor capacitor being connected in series, and a bypass diode connected across the resistor for preventing overvoltage when the load is discharged by said means for discharging.

8. The circuit of claim 1 wherein the switch is a semiconductor device incapable of withstanding more than a predetermined voltage, further including means for controlling the voltage across the switch while the switch is opening so the voltage across the semiconductor device is limited to a value that is less than the predetermined voltage.

9. The circuit of claim 8 wherein the controlling means for the switch voltage includes a capacitor connected to the first winding means, and means for connecting the capacitor to the switch so the voltage across the semiconductor device is limited to a value that is less than the predetermined voltage.

10. A circuit for charging a pulse forming network or capacitor load to a precise voltage from an energy storage device comprising a switch, a transformer having a first winding means connected in series with said switch and energy storage device and a second winding means connected in series with said load, and means responsive to the load for opening said switch prior to the load reaching the precise voltage; the opening time of the switch, the transformer, the load and circuitry connected to the transformer, switch and load being such that the second winding means continues to couple energy to the load after opening of said switch to cause the load voltage to attain the precise voltage.

11. The circuit of claim 10 further including means for coupling energy not needed for the load to attain the precise voltage from the transformer to the storage device after opening of the switch.

12. The circuit of claim 11 wherein the energy coupling means includes: a capacitor connected to one of the winding means to be responsive to current flowing in said one winding means at the time the switch is opened so that charge is accumulated on the capacitor in response to the energy stored in the transformer when the switch is opened, and means for transferring some of the charge accumulated on the capacitor to the energy storage device.

13. The circuit of claim 10 wherein the switch is a semiconductor device incapable of withstanding more than a predetermined voltage, further including means for controlling the voltage across the switch while the switch is opening so the voltage across the semiconductor device is limited to a value that is less than the predetermined voltage.

14. The circuit of claim 10 wherein the switch opening means is responsive to the load voltage and current.

15. The circuit of claim 10 wherein the switch opening means includes a monitor circuit responsive to the load voltage and current.

16. The circuit of claim 15 wherein the monitor circuit is connected in series with the load and second winding means and includes a first impedance for deriving a first response for the load voltage and a second impedance for deriving a second response for the load current.

17. The circuit of claim 16 wherein the first and second impedances respectively include a monitor capacitor and a resistor, the resistor and monitor capacitor being connected in series.

18. A circuit for charging a pulse forming network or capacitor load from an energy storage device comprising a switch switched from a closed to an open state, a transformer having a first winding means connected in series with said switch and energy storage device and a second winding means connected in series with said load, the second winding means coupling current to said load, the current flowing in the second winding means flowing therein in response to current flowing from the energy storage device through the switch to the first winding means, a branch circuit in shunt with said first winding means, said branch circuit including a capacitor charged after the switch is switched from a closed to an open state in response to energy stored in the transformer at the time said switch is switched from the closed to the open state, means for connecting the branch circuit, the transformer and load for coupling a portion of the charge on the capacitor to the load, and means for coupling another portion of the charge on the capacitor to the energy storage device.

19. The circuit of claim 18 wherein the switch is a semiconductor device incapable of withstanding more than a predetermined voltage, the capacitor being connected to the switch to limit the voltage across the switch after the switch is open to a value that is less than the predetermined value.

20. The circuit of claim 19 wherein the means for coupling another portion of the current charging the capacitor includes a second transformer having a third winding means connected to be responsive to the another portion of the current and a fourth winding means connected via first impedance means to one electrode of the switch and the energy storage means, the circuit branch including a second impedance means connected to another electrode of the switch.

21. The circuit of claim 20 further including an inductor connected between the fourth winding means and the energy storing device.

22. The circuit of claim 18 further including a voltage snubber circuit connected in shunt with the switch.

23. The circuit of claim 18 further including a non-linear impedance connected in shunt with said first winding means and switch, the non-linear impedance being substantially an open circuit for voltages across it less than a first predetermined value and being substantially a short circuit for voltages across it in excess of a second predetermined value, said second value being greater than the first predetermined value.

24. The circuit of claim 18 further including a monitor circuit responsive to indications of voltage across the load and current flowing through the load for controlling when the switch is activated from a closed to an open state.

25. The circuit of claim 24 wherein the monitor circuit is connected in circuit with the load and second winding means and includes a first impedance for deriving a first response for the load voltage and a second impedance for deriving a second response for the load current.

26. The circuit of claim 25 wherein the first and second impedances respectively include a monitor capacitor and a resistor, the resistor and monitor capacitor being connected in series.

27. A circuit for charging a pulse forming network or capacitor load from an energy storage device comprising a switch switched from a closed to an open state, transformer means having first, second and third winding means, the first winding means being connected in series with said switch and energy storage device, the second winding means being connected in series with said load for coupling current to said load, the current flowing in the second winding means flowing therein in response to current flowing from the energy storage device through the switch to the first winding means, said third winding means being coupled with said first winding means and connected to said energy storage device for coupling energy stored in the transformer to the energy storage device at the time said switch is switched from the closed to the open state.

28. The circuit of claim 27 further including a monitor circuit responsive to indications of voltage across the load and current flowing through the load for controlling when the switch is activated from a closed to an open state.

29. The circuit of claim 28 wherein the monitor circuit is connected in circuit with the load and second winding means and includes a first impedance for deriving a first response for the load voltage and a second impedance for deriving a second response for the load current.

30. The circuit of claim 29 wherein the first and second impedances respectively include a monitor capacitor and a resistor, the resistor and monitor capacitor being connected in series.

31. The circuit of claim 27 wherein the transformer means includes first and second transformers, the first transformer including the first and second winding means, the second transformer including the third winding means, and circuit means for coupling the third winding means to be responsive to voltage developed across the first winding means.

32. A method of charging a pulse forming network or capacitor load to a precise voltage from an energy storage device with a circuit including a switch, a transformer having a first winding means connected in series with said switch and energy storage device and a second winding means connected in series with said load, the method comprising supplying energy from the energy storage device to an energy storing means including the transformer via the switch while the switch is closed so energy is stored in the energy storing means while the switch is closed, responding to the load to open the switch prior to the load reaching the precise voltage, and transferring energy stored in the energy storing means to the load after the switch has been opened to cause the load voltage to attain the precise voltage.

33. The method of claim 32 further including coupling energy not needed for the load to attain the precise voltage from the transformer to the storage device after opening of the switch.

34. The method of claim 33 wherein the switch is opened by responding to indications of voltage across the load and current flowing in the load.

35. The method of claim 32 wherein the switch is opened by responding to indications of voltage across the load and current flowing in the load.

36. The method of claim 32 wherein the switch is a semiconductor device incapable of withstanding more than a predetermined voltage, the method further including controlling the voltage across the switch while the switch is opening so the voltage across the semiconductor device is limited to a value that is less than the predetermined voltage.

* * * * *